United States Patent [19]

Van De Plassche et al.

[11] Patent Number: 5,886,544
[45] Date of Patent: *Mar. 23, 1999

[54] SIGNAL PROCESSING WITH SAMPLING

[75] Inventors: Rudy J. Van De Plassche; Arnoldus G. W. Venes, both of Eindhoven, Netherlands

[73] Assignee: U.S. Philips Corporation, NY, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 708,380

[22] Filed: Sep. 4, 1996

[30] Foreign Application Priority Data

Sep. 8, 1995 [EP] European Pat. Off. ............. 95202444

[51] Int. Cl.$^6$ .................................................. G11C 27/02
[52] U.S. Cl. ............................................. 327/91; 327/104
[58] Field of Search ..................... 348/725, 726, 348/731; 364/133; 327/91, 100, 104; 455/120; 341/122, 123

[56] References Cited

U.S. PATENT DOCUMENTS

| | | | |
|---|---|---|---|
| 3,754,236 | 8/1973 | Dotson, Jr. ...................... | 340/347 DA |
| 4,190,898 | 2/1980 | Farnsworth et al. .................... | 364/900 |
| 4,573,033 | 2/1986 | Kolodin ........................... | 340/347 DA |
| 4,779,054 | 10/1988 | Monteleone et al. ..................... | 329/50 |
| 4,831,379 | 5/1989 | van de Plassche ..................... | 341/156 |
| 5,159,337 | 10/1992 | Lankreijer ................................. | 341/67 |
| 5,307,067 | 4/1994 | Kimura et al. .......................... | 341/159 |
| 5,392,044 | 2/1995 | Kotzin et al. ............................ | 341/155 |
| 5,640,163 | 6/1997 | Nauta et al. ............................. | 341/155 |

OTHER PUBLICATIONS

IEEE Journal of Solid–State Circuits, vol. sc–22, No. 6, Dec. 1987, Van De Grift, "An 8–bit Video ADC Incorporating Folding and Interpolation Technques", p. 944, col. 2, line 28—p. 945, col. 1, line 25, figure 2.

"Fully Bipolar, 120–Msample/s 10–b Track–and–Hold Circuit" by P. Vorenkamp and J.P.M. Verdaasdonk, IEEE JSSC, vol. 27, No. 7, Jul. 1992, pp. 988–992.

Primary Examiner—My-Trang Nu Ton
Attorney, Agent, or Firm—Steven R. Biren

[57] ABSTRACT

A signal-processing arrangement includes a conversion circuit CONV which converts an input signal Sin into sub-ranging signals Sc(1)..Sc(N) corresponding to different amplitude sub-ranges of the input signal Sin. Each sub-range signal is supplied to a respective one of an array of sampling circuits SC(1)..SC(N) which supplies successive samples thereof to a processing circuit PROC for processing in accordance with operations which may constitute or include A/D conversion. Such an arrangement is particularly suitable for use in a television receiver, multimedia or other video image display apparatus, and various types of disc-players and tape-recorders.

4 Claims, 3 Drawing Sheets

SIGNAL PROCESSING WITH SAMPLING

BACKGROUND OF THE INVENTION

1. Field of the Invention

The invention generally relates to a signal-processing arrangement and method in which a sampling operation is carried out. Such a signal-processing arrangement may be, for example, a video data acquisition and conversion chain incorporating an analog-to-digital (A/D) converter. Such a signal-processing arrangement may also be, for example, an A/D converter as such.

2. Description of the Related Art

The article "Fully Bipolar, 120-Msample/s 10-b Track-and-Hold Circuit" by P. Vorenkamp and J. P. M. Verdaasdonk, IEEE JSSC, Vol. 27, No. 7, July 1992, pp. 988–992 describes a prior-art video data acquisition and conversion chain. At the input of the chain an analog video signal is applied. The analog video signal is filtered and fed into a track-and-hold (T/H) circuit which carries out a sampling operation. The sampled analog video signal is fed into a data conversion and processing module consisting of an A/D converter, a digital signal processor (DSP), and a digital-to-analog (D/A) converter. The cited article mentions that the T/H circuit, which is used as a presampler in front of the A/D converter, improves the high-frequency performance of the A/D converter.

U.S. Pat. No. 4,831,379, issued May 16, 1989(attorney's docket PHA 1,137) assigned to a related assignee, describes a prior-art A/D converter which comprises an array of 64 input amplifiers. Assuming that i is an integer ranging from 0 to 63, each amplifier Ai amplifies the difference between an analog input voltage and a corresponding reference voltage VRi to produce an amplified output voltage VAi. The amplified output voltages VA0–VA63 are processed in a folding array and an interpolation circuit to produce complementary signals VD0/VDN0 ... VD31/VDN31 from which signals an output code.

SUMMARY OF THE INVENTION

The invention seeks, inter alia, to provide a type of signal processing as identified above which, with respect to the prior art, allows a better compromise between high-frequency performance, on the one hand, and power consumption and/or costs, on the other hand. To this end, a first aspect of the invention provides a signal-processing arrangement; a second aspect provides a method of signal processing; and other aspects provide a receiver, a multimedia apparatus and an information read-out arrangement.

The invention takes the following factors into consideration. Generally, if a sampling circuit is placed in front of a signal processor, the sampling circuit should have a performance which is commensurate with that of the signal processor. If the signal processor has a relatively high performance, in the case of, for example, a high-resolution A/D conversion, the sampling circuit will be relatively complex and hence costly. If, in addition, the sampling circuit has to cope with high-frequency input signals, it will also consume an appreciable amount of power.

A signal processor may comprise a conversion circuit which converts an input signal into sub-ranging signals associated with different amplitude sub-ranges. The above-identified prior-art A/D converter of U.S. Pat. No. 4,831,379, is such a signal processor. There in an array of 64 input amplifiers converts the input signal into 64 sub-ranging signals, namely the amplified output voltages VA0 ... VA63. Each of the amplified output voltages VA0 ... VA63 is associated with an amplitude sub-range centred around the respective reference voltages VR0 ... VR63.

In accordance with the invention, in such a signal processor, a plurality of sampling circuits is used to sample the sub-ranging signals, rather than one sampling circuit which samples the entire input signal as in the prior art. At first sight, this may appear to contradict the above-mentioned object of the invention: is not a plurality of sampling circuits more complex and more power-consuming than one sampling circuit ? In most cases, the answer is no for the reasons set out below.

First, in the prior art, the sampling circuit has to handle the full peak-to-peak amplitude variation of an input signal in a linear manner. In the invention, the conversion circuit effectively sub-divides the input signal into several portions. A sampling circuit has to handle only one of these portions in accordance with a linear manner. Consequently, in the invention, a sampling circuit can be much less linear than the sampling circuit in the prior art.

Secondly, in the prior art, the sampling circuit is coupled to the A/D converter input which has a relatively high value capacitance. The reason is that A/D converter input transistors need to be relatively large in order to obtain a satisfactory A/D conversion accuracy. In the invention, a sampling circuit is coupled to other circuitry having inputs which may have a relatively low value capacitance. Consequently, in accordance with the invention, a sampling circuit needs to provide much less output current at high frequencies than the sampling circuit in the prior art.

Thirdly, in the prior art, the sampling circuit fully affects the performance of the arrangement of which it forms part, in terms of noise and accuracy. In accordance with the invention, a sampling circuit only partially affects the performance of the arrangement of which it forms part. With the invention, the performance is only affected by those sampling circuits which receive a sub-ranging signal associated with an amplitude sub-range in which the momentary amplitude of the input signal is located. The other sampling circuits receive sub-ranging signals at a fixed level and, therefore, hardly produce any noise or dynamic errors. Consequently, with the invention, a sampling circuit does not need to have as low noise and/or as high precision as the sampling circuit in the prior art.

In summary, in accordance with the invention, a sampling circuit needs to meet much less stringent requirements than the sampling circuit in the prior art. With the invention, each sampling circuit in the plurality of sampling circuits generally has such a reduced complexity and/or power consumption that even this plurality is less complex and consumes less power than the single sampling circuit in the prior art. Moreover, with the invention, the requirements imposed on the sampling circuit may be sufficiently relaxed for the circuit to be feasible, whereas, in the prior art, the requirements imposed on the single sampling circuit are so stringent that the circuit is not feasible, unless elements having better physical properties are used. Thus, an arrangement according to the invention may attain a higher level of performance than the prior-art arrangement, with elements having similar physical properties. For example, the invention allows a high-frequency A/D conversion to be carried out with MOS-transistors designed for digital signal processing. Consequently, the invention allows an economical integration of a high-frequency A/D converter with a digital signal processor on a single chip. Such a single chip is particularly suitable for use in a receiver or a multimedia apparatus.

BRIEF DESCRIPTION OF THE DRAWINGS

The invention and additional features, which may optionally be used to implement the invention to advantage, will be apparent from and elucidated with reference to the examples described hereafter, with reference to the accompanying drawings, wherein: In the drawings.

Like elements are denoted by like reference numerals throughout the drawings.

DESCRIPTION OF THE PREFERRED EMBODIMENTS

Figure 1:
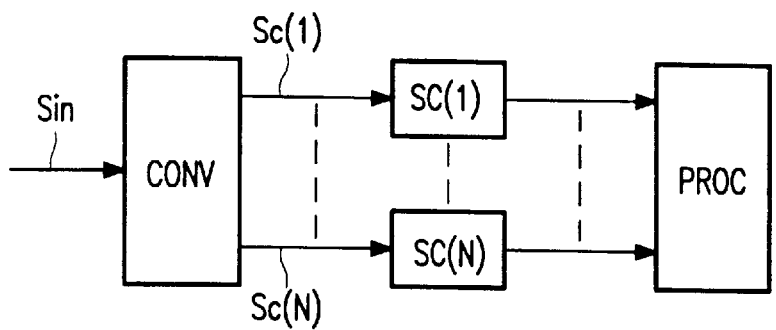
FIG. 1 shows, in a block diagram form, a basic example of a signal-processing arrangement in accordance with the invention.

FIG. 1 shows a basic example of a signal-processing arrangement in accordance with the invention. The FIG. 1 signal-processing arrangement, comprises the following parts: a conversion circuit CONV, sampling circuits SC(1) ... SC(N), N being an integer, and a processing part PROC. The conversion circuit CONV converts the input signal Sin into sub-ranging signals Sc(1) ... Sc(N) which are associated with different amplitude sub-ranges. The sampling circuits SC(1) ... SC(N) supply sampled portions of the sub-ranging signals Sc(1) ... Sc(N) to a processing circuit PROC.

Preferably, but not necessary, the conversion circuit CONV has a gain factor of substantially more than one. The higher the gain factor, the lesser the extent to which any noise and/or offset in the sampling circuits SC(1) ... SC(N) will affect the performance of the FIG. 1 signal-processing arrangement. Thus, if the conversion circuit CONV has a gain factor of substantially more than one, the requirements imposed on the sampling circuits SC(1) ... SC(N) will be relatively relaxed and, consequently, the sampling circuits may be relatively simple.

Figure 2:
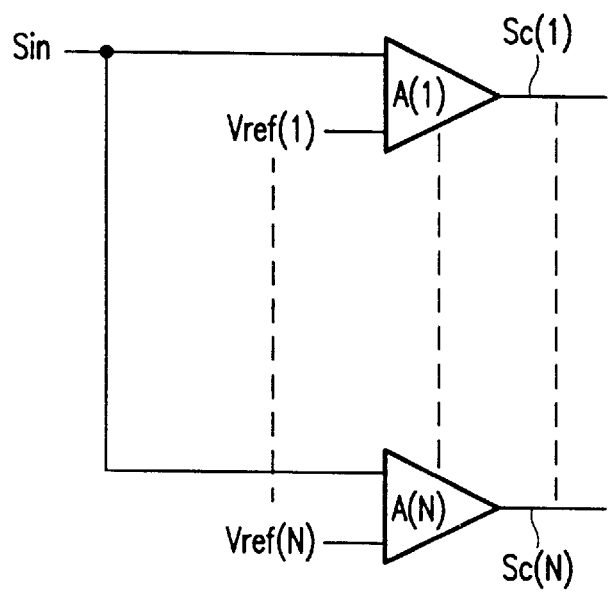
FIG. 2 shows, in a block diagram form, a first example of a conversion circuit for use in the FIG. 1 signal-processing arrangement.
Figure 3:
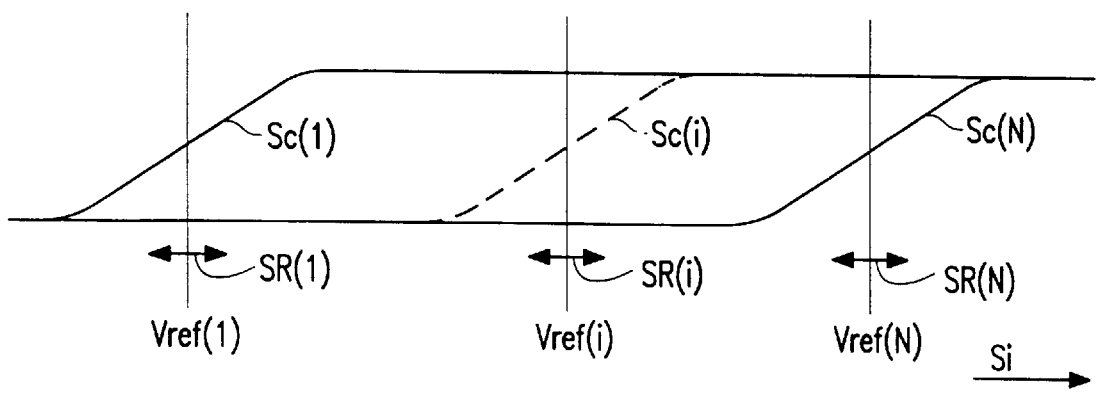
FIG. 3 shows an example of sub-ranging signals provided by the FIG. 2 conversion circuit.
Figure 4:
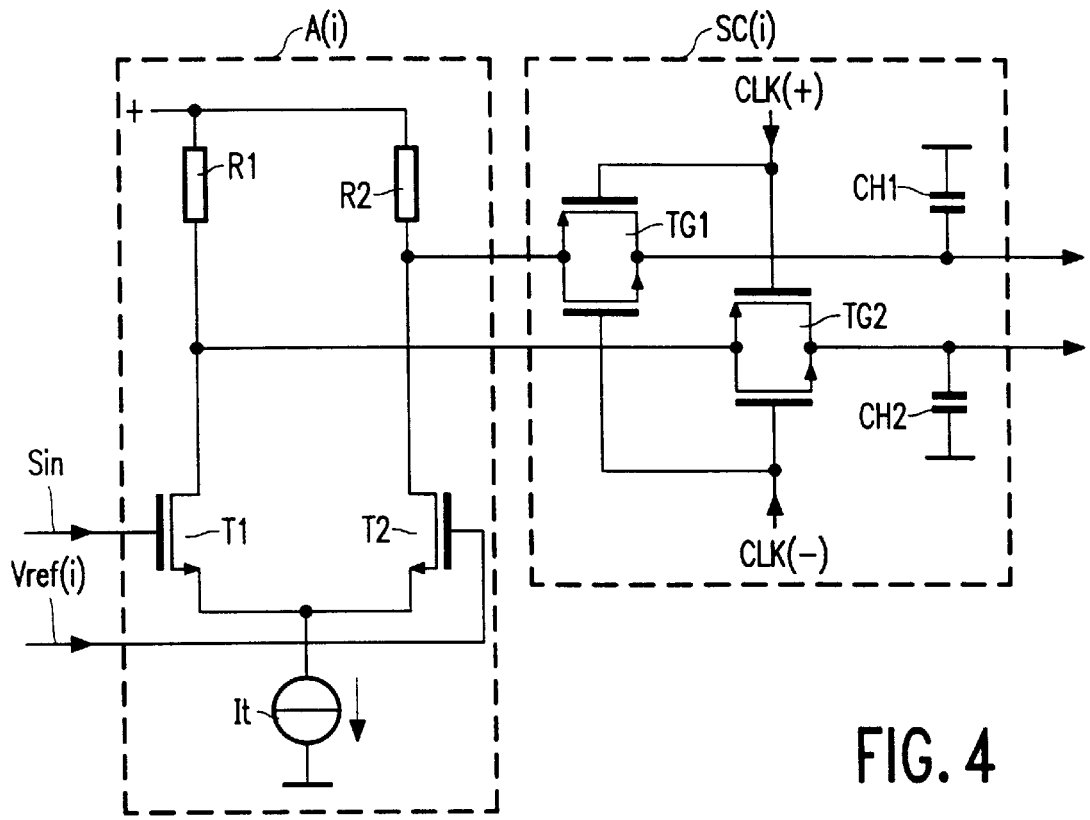
FIG. 4 shows, in a circuit diagram form, an example of an input amplifier in the FIG. 2 conversion circuit and, in combination, a sampling circuit.
Figure 5:
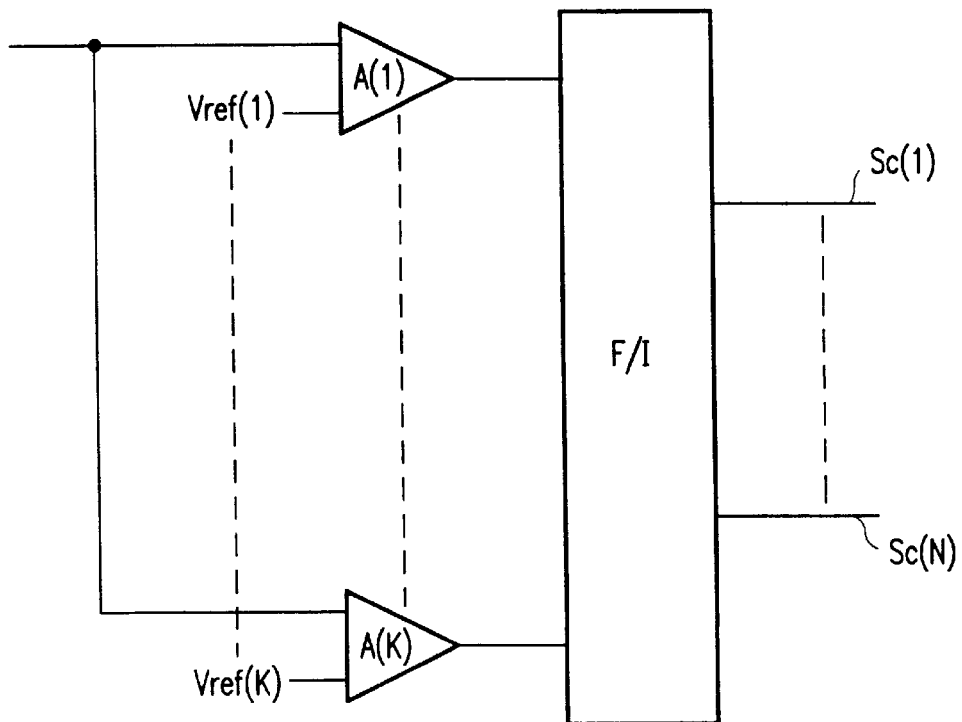
FIG. 5 shows, in a block diagram form, a second example of a conversion circuit for use in the FIG. 1 signal-processing arrangement.

The FIG. 1 signal-processing arrangement may be, for example, an A/D converter in which folding and/or interpolation operations are carried out. In that case, there are basically two options. One option is to carry out all the folding and/or interpolation operations in the processing circuit PROC. FIGS. 2 to 4 relate to that option. The other option is to carry out at least one of the folding and/or interpolation operations in the conversion circuit CONV. FIG. 5 relates to that option. An advantage of the first option over the second option, is that the all folding and/or interpolation operations benefit from sampling. However, an advantage of the second option over the first option, is that fewer sampling circuits may be needed. It should be noted that the above cited U.S. Pat. No. 4,831,379 and European Patent Application No. 96202014.5 (attorney's docket PHN 15.909 EP-p), assigned to the present assignee and both incorporated herein by reference, describe A/D converters in which folding and/or interpolation operations are carried out. Said European Application corresponds to copending U.S. application Ser. No. 08/709,401, filed Sep. 4, 1996.

FIG. 2 shows a first example of a conversion circuit for use in the FIG. 1 signal-processing arrangement. The FIG. 2 conversion circuit comprises an array of input differential amplifiers A(1) ... A(N) which receives different reference voltages Vref(1) ... Vref(N). Each input amplifier amplifies the difference between the input signal Sin and the reference voltage supplied thereto.

FIG. 3 shows an example of the sub-ranging signals Sc(1) ... Sc(N) provided by the FIG. 2 conversion circuit. The FIG. 3 sub-ranging signals are the result of a slope-like input signal Sin. Assuming that i is an integer ranging from 1 to N, each sub-ranging signal Sc(i) is associated with an amplitude sub-range SR(i) centred around the reference voltage Vrefi. It should be noted that it is not essential to the invention, whether or not there is any overlap between the amplitude sub-ranges SR(1) ... SR(N). This is a matter for the processing circuit PROC in the FIG. 1 signal-processing arrangement. European Patent Appl. No. 95202355.4 (attorney's docket PHN 15.450 EP-p), assigned to the present assignee, is incorporated by reference herein and describes a processing circuit for A/D conversion purposes which is suitable to process overlapping sub-ranging signals. It corresponds to allowed copending U.S. application Ser. No. 08/704,198, filed Aug. 28, 1996.

FIG. 4 shows an example of an input amplifier A(i) for use in the FIG. 2 conversion circuit and, in combination, a sampling circuit SC(i). The input amplifier A(i) is basically a differential pair of transistors T1, T2 with a pair of load resistor R1, R2 and a tail current source It coupled thereto. The sampling circuit SC(i) is basically a pair of transmission gates TG1, TG2 and a pair of hold-capacitors CH1, CH2 coupled thereto. It carries out a track-and-hold operation in a differential form. The transmission gates TG1, TG2 are formed by two transistors coupled in parallel. One transistor is controlled by a clock signal CLK(+), the other transistor is controlled by an inverse clock signal CLK(−).

FIG. 5 shows a second example of a conversion circuit for use in the FIG. 1 signal-processing arrangement. The FIG. 5 conversion circuit differs from the FIG. 2 conversion circuit in the following respect. The FIG. 5 conversion circuit also includes an additional circuit F/I which carries out folding and/or interpolation operations. The additional circuit F/I receives signals which are provided by an array of input amplifiers A(1) ... A(K) and provides, in response, the sub-ranging signals Sc(1) ... Sc(N).

Of course, the sub-ranging signals Sc(1) ... Sc(N) provided by the FIG. 5 conversion circuit differ from those provided by the FIG. 2 conversion circuit. To give an example, assume for the Fig. 5 conversion circuit, that there are 64 input amplifiers, K=64, and that the additional circuit F/I carries out a folding operation by a factor of 8. In that case, N=8 and the FIG. 5 conversion circuit will provide 8 sub-ranging signals Sc(1)..Sc(8). The sub-ranging signal Sc(1) may be associated with amplitude sub-ranges centred around Vref(1), Vref(9), Vref(17), ... Vref(57), the sub-ranging signal Sc(2) may be associated with amplitude sub-ranges Vref(2), Vref(10), Vref(18), ... Vref(58), and so on.

Figure 6A:
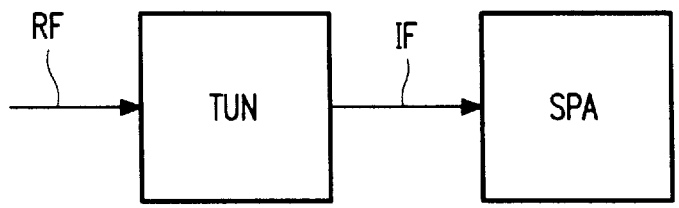
FIG. 6a to 6c respectively show, in a block diagram form, a basic example of a receiver and a basic example of a multimedia apparatus in accordance with the invention.
Figure 6B:
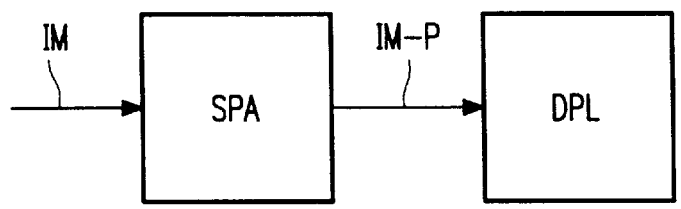
Figure 6C:
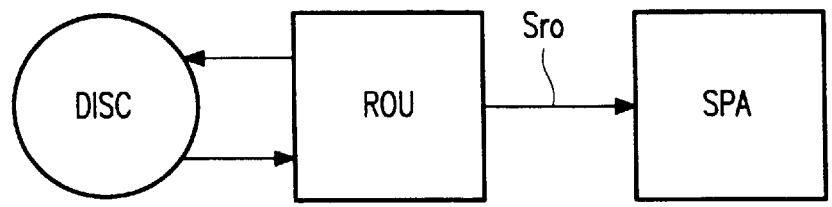

FIG. 6a, 6b and 6c show basic examples of a receiver, a multimedia apparatus, and an information read-out arrangement, respectively, in accordance with the invention. The FIG. 6a receiver comprises a tuner TUN and the FIG.

1 signal-processing arrangement SPA. The tuner TUN provides in response to a reception signal RF an intermediate frequency signal IF. The FIG. 1 signal-processing arrangement SPA processes the intermediate frequency signal, for example, by consecutively carrying out A/D conversion and demodulation.

The FIG. 6b multimedia apparatus comprises the FIG. 1 signal-processing arrangement SPA and a display device DPL. The FIG. 1 signal-processing arrangement SPA receives an image signal IM and provides, in response, a processed image signal IM-P. The display device DPL displays the processed image signal IM-P. The FIG. 6b multi-media apparatus may be, for example, a television receiver or a computer receiving image signals from a CD-ROM, CD-I or DVD-player.

The FIG. 6c information read-out arrangement comprises a read-out unit ROU and the FIG. 1 signal-processing arrangement SPA. The read-out unit reads out an information carrier DISC so as to obtain an read-out signal Sro. The FIG. 1 signal-processing arrangement SPA processes the read-out signal Sro, to obtain a suitable output signal and/or to obtain control signals for the read-out unit ROU, for example. The FIG. 6c read-out arrangement may be, for example, a CD-, a CD-I, a CD-ROM, or a DVD-player or a (video-)tape recorder. Although FIG. 6c shows the information carrier DISC in the form of a disc, it will be understood that the information carrier may also be a tape or even a clay tablet.

It should be noted that the above-described examples illustrate rather than limit the invention. Evidently there are numerous alternatives which fall within the scope of the appended Claims. Any reference signs between parentheses shall not be construed as limiting the Claim concerned.

We claim:

1. A signal-processing arrangement comprising:
   a conversion part for converting a supplied input signal into a series of sub-range signals corresponding to different amplitude sub-ranges of the input signal;
   a pre-processing part coupled to said conversion part for subjecting the sub-range signals to folding and/or interpolation to a limited extent to convert them into a lesser number of pre-processed sub-range signals;
   a sampling part coupled to the pre-processing part and which includes respective sampling circuits for the respective pre-processed sub-range signals, each sampling circuit deriving time sequential samples of the relevant pre-processed sub-range signal, without any rounding off in amplitude each, sample being associated with an amplitude sub-range of said pre-processed sub-range signal at the sampling instant; and
   a processing part coupled to the sampling part for further processing the pre-processed sub-range signal samples in accordance with more extensive folding and interpolation operations preliminary to or accompanying analog-to-digital conversion of said input signal.

2. A signal-processing arrangement as claimed in claim 1, wherein the conversion part is a circuit having a gain factor substantially greater than one.

3. A method of processing a supplied input signal, comprising the steps of:
   converting the input signal into a series of sub-range signals corresponding to different amplitude sub-ranges of the input signal;
   pre-processing the sub-range signals by subjecting them to folding and/or interpolation to a limited extent to convert them into a lesser number of pre-processed sub-range signals;
   sampling each of the pre-processed sub-range signals without any rounding off in amplitude to obtain time sequential samples thereof, each sample being associated with an amplitude sub-range of the related pre-processed sub-range signal at the sampling instant; and
   processing the pre-processed sub-range signal samples in accordance with more extensive folding and interpolation operations preliminary to or accompanying analog-to-digital conversion of said input signal.

4. A method as claimed in claim 3, wherein conversion of the input signal into sub-range signals is carried out with a gain factor substantially greater than one.

* * * * *